United States Patent
Rho

(10) Patent No.: US 10,490,274 B2
(45) Date of Patent: Nov. 26, 2019

(54) NON-VOLATILE SEMICONDUCTOR MEMORY DEVICE WITH IMPROVED PRE-CHARGING FOR HIGH SPEED OPERATION

(71) Applicant: SK hynix Inc., Icheon-si (KR)

(72) Inventor: Kwang-Myoung Rho, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/114,072

(22) Filed: Aug. 27, 2018

(65) Prior Publication Data

US 2018/0366190 A1 Dec. 20, 2018

Related U.S. Application Data

(62) Division of application No. 15/291,945, filed on Oct. 12, 2016, now Pat. No. 10,062,436.

(30) Foreign Application Priority Data

Feb. 15, 2016 (KR) .......................... 10-2016-0017012

(51) Int. Cl.
*G11C 13/00* (2006.01)
*G11C 7/10* (2006.01)
(Continued)

(52) U.S. Cl.
CPC ............ *G11C 13/0064* (2013.01); *G11C 7/02* (2013.01); *G11C 7/08* (2013.01); *G11C 7/1072* (2013.01); *G11C 7/12* (2013.01); *G11C 8/08* (2013.01); *G11C 11/161* (2013.01); *G11C 13/0004* (2013.01); *G11C 13/004* (2013.01);
(Continued)

(58) Field of Classification Search
CPC .......... G11C 7/1072; G11C 8/08; G11C 7/02; G11C 16/26; G11C 13/0069; G11C 13/0007; G11C 13/0004; G11C 11/161; G11C 13/004
See application file for complete search history.

(56) References Cited

U.S. PATENT DOCUMENTS

2011/0242872 A1* 10/2011 Hanzawa ................. G11C 7/18
365/51
2011/0297912 A1* 12/2011 Samachisa ........... G11C 13/003
257/5
(Continued)

FOREIGN PATENT DOCUMENTS

KR 10-2014-0078849 6/2016

*Primary Examiner* — Ajay Ojha
(74) *Attorney, Agent, or Firm* — Perkins Coie LLP

(57) ABSTRACT

The semiconductor memory includes a plurality of word lines; and a plurality of columns including a plurality of resistive storage cells corresponding to the plurality of word lines, the plurality of columns being divided into a plurality of pages each having one or more columns; a memory circuit coupled to the semiconductor memory to sense data stored in the resistive storage cells; and a memory control circuit coupled to the semiconductor memory and the memory circuit to control sensing of the stored data by the memory circuit to, in a read operation, sense data of resistive storage cells included in a selected page by continuously active-precharging one or more word lines among the plurality of word lines in a period in which the selected page among the plurality of pages is activated.

14 Claims, 12 Drawing Sheets

(51) Int. Cl.
- *G11C 11/16* (2006.01)
- *G11C 16/26* (2006.01)
- *G11C 7/02* (2006.01)
- *G11C 8/08* (2006.01)
- *G11C 7/08* (2006.01)
- *G11C 7/12* (2006.01)

(52) U.S. Cl.
CPC ...... *G11C 13/0007* (2013.01); *G11C 13/0069* (2013.01); *G11C 16/26* (2013.01)

(56) References Cited

U.S. PATENT DOCUMENTS

| | | |
|---|---|---|
| 2012/0126783 A1 | 5/2012 | Jefremow et al. |
| 2013/0044531 A1* | 2/2013 | Baek ................... G11C 5/025 |
| | | 365/72 |
| 2013/0238856 A1 | 9/2013 | Loh et al. |
| 2014/0244930 A1 | 8/2014 | Lee |
| 2015/0023108 A1 | 1/2015 | Kang et al. |
| 2016/0019940 A1 | 1/2016 | Jang et al. |
| 2016/0064056 A1 | 3/2016 | Kim et al. |
| 2016/0099049 A1 | 4/2016 | Lee et al. |
| 2016/0379708 A1* | 12/2016 | Katayama ........... G11C 11/1653 |
| | | 365/148 |

* cited by examiner

NON-VOLATILE SEMICONDUCTOR MEMORY DEVICE WITH IMPROVED PRE-CHARGING FOR HIGH SPEED OPERATION

CROSS-REFERENCE TO RELATED APPLICATION

This patent document is a divisional of, and claims priority and benefits of, U.S. patent application Ser. No. 15/291,945, published as US 2017/0236568 A1, entitled "ELECTRONIC DEVICE," and filed on Oct. 12, 2016, which further claims priority of Korean Patent Application No. 10-2016-0017012, entitled "ELECTRONIC DEVICE" and filed on Feb. 15, 2016. The contents of the before-mentioned patent applications (including US 2017/0236568 A1) are incorporated herein by reference in their entirety as part of the disclosure of this document.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes an electronic device which ensures efficiency of high speed page operation by expanding a range of the page.

The disclosed technology includes an electronic device in which a high speed operation is possible by reducing a precharge operation of a sense amplifier, and by reducing noise accompanied with the precharge operation of the sense amplifier.

In one embodiment, an electronic device may include a semiconductor memory. The semiconductor memory may include a plurality of word lines; and a plurality of columns including a plurality of resistive storage cells corresponding to the plurality of word lines, the plurality of columns being divided into a plurality of pages each having one or more columns; a memory circuit coupled to the semiconductor memory to sense data stored in the resistive storage cells; and a memory control circuit coupled to the semiconductor memory and the memory circuit to control sensing of the stored data by the memory circuit to, in a read operation, sense data of resistive storage cells included in a selected page by continuously active-precharging one or more word lines among the plurality of word lines in a period in which the selected page among the plurality of pages is activated.

The electronic device may further include a plurality of sense amplifiers which correspond to one page among the plurality of pages, and sense data of the resistive storage cells included in corresponding one or more columns among the plurality of columns.

The period in which the selected page is activated is a period in which one or more sense amplifiers corresponding to the selected page among the plurality of sense amplifiers are activated.

The sense amplifier may sense data of a resistive storage cell corresponding to a selected column among the corresponding one or more columns and an activated word line among the plurality of word lines in the activated period.

When two or more read operations continuously perform, and the same page may be selected in the two or more read operations, the selected page may be maintained as an activation state until the last read operation of the two or more read operations is terminated from start of a first read operation of the two or more read operations.

When a selected page in a previous read operation and a selected page in a current read operation may be different, the selected page in the previous read operation may be inactivated, and the selected page in the current read operation may be activated.

The plurality of sense amplifiers may sense the data of the resistive storage cell by comparing a current which flows in the resistive storage cell with a reference current.

The resistive storage cell may include a selection element which is coupled to a corresponding word line; and a variable resistance element of which a resistance value is determined according to data stored in the resistive storage cells.

The variable resistance element may include any one of a metal oxide material and a structure having a tunnel barrier interposed between two magnetic layers.

The electronic device may further include a microprocessor. The microprocessor may include a control unit for receiving a signal having a command from an outside of the microprocessor, extracting or decoding the command, or performing input/output control of the signal of the microprocessor; an operation unit for performing an operation according to a decoding result of the command in the control unit; and a storage unit for storing data to be operated, data corresponding to an operation result, or an address of the data to be operated. The semiconductor memory may be a part of the storage unit within the microprocessor.

The electronic device may further include a processor. The processor may include a core unit for performing an operation corresponding to a command using data according to the command input from an outside of the processor; a cache memory unit for storing data to be operated, data corresponding to an operation result, or an address of the data to be operated; and a bus interface which is coupled between the core unit and the cache memory unit, and transfers data between the core unit and the cache memory unit. The semiconductor memory may be a part of the cache memory unit within the processor.

The electronic device may further include a processing system. The processing system may include a processor for interpreting a received command, and controlling an operation of information according to an interpreting result of the command; an auxiliary memory device for storing a program for interpreting the command and the information; a main memory device for importing and storing the program and the information from the auxiliary memory device such that the processor may perform the operation using the program and the information when the program is executed; and an interface device for performing communication between one or more of the processor, the auxiliary memory device and the main memory device and an outside. The semiconductor memory may be a part of the auxiliary memory device or the main memory device within the processing system.

The electronic device may further include a data storage system. The data storage system may include a storage device for storing data and retaining the stored data regardless of a power supply; a controller for controlling data input/output of the storage device according to a command input from an outside; a temporary storage device for temporarily storing the data which is exchanged between the storage device and the outside; and an interface for performing communication between one or more of the storage device, the controller and the temporary storage device and the outside. The semiconductor memory may be a part of the storage device or the temporary storage device within the data storage system.

The electronic device may further include a memory system. The memory system may include a memory for storing data and retaining the stored data regardless of a power supply; a memory controller for controlling data input/output of the memory according to a command input from an outside; a buffer memory for buffering the data which is exchanged between the memory and the outside; and an interface for performing communication between one or more of the memory, the memory controller and the buffer memory and the outside. The semiconductor memory may be a part of the memory or the buffer memory within the memory system.

In another embodiment, an electronic device may include a semiconductor memory. The semiconductor memory may include a plurality of word lines; a plurality of local line pairs coupled to which a plurality of resistive storage cells corresponding to one word line among the plurality of word lines are coupled, each of the local line pairs including a local bit line and a local source line; global line pairs corresponding to the plurality of local line pairs, each of the global line pairs including a global bit line and a global source line; and sense amplifiers coupled to a corresponding global line pair among the global line pairs and for sensing data of a selected resistive storage cell, wherein the semiconductor memory is divided into a plurality of pages having one or more global line pairs among the global line pairs, and in a read operation, the semiconductor memory continuously active-precharges one or more word lines among the plurality of word lines in a period in which the selected page is activated among the plurality of pages and senses data of resistive storage cells included in a selected page.

Each of the plurality of pages may correspond to one or more sense amplifiers of the sense amplifiers.

The period in which the selected page may be activated is a period in which one or more sense amplifiers may be activated corresponding to the selected page among the sense amplifiers.

The sense amplifier may sense data of a resistive storage cell which is coupled to a selected local line pair corresponding to the coupled the global line pair among the plurality of the local line pairs and an activated word line among the plurality of word lines in the activated period.

When two or more read operations may continuously perform, and the same page may be selected in the two or more read operations, the selected page may be maintained as an activation state until the last read operation of the two or more read operations may be terminated from start of a first read operation of the two or more read operations.

The resistive storage cell may include a selection element which is coupled to a corresponding word line; and a variable resistance element of which a resistance value is determined according to data stored in the resistive storage cell, and wherein the selection element and the variable resistance element are coupled between a corresponding local line pair among the local line pairs.

The variable resistance element may include any one of a metal oxide material and a structure having a tunnel barrier interposed between two magnetic layers.

The electronic device may further include a microprocessor. The microprocessor may include a control unit for receiving a signal having a command from an outside of the microprocessor, extracting or decoding the command, or performing input/output control of the signal of the microprocessor; an operation unit for performing an operation according to a decoding result of the command in the control unit; and a storage unit for storing data to be operated, data corresponding to an operation result, or an address of the data to be operated. The semiconductor memory may be a part of the storage unit within the microprocessor.

The electronic device may further include a processor. The processor may include a core unit for performing an operation corresponding to a command using data according to the command input from an outside of the processor; a cache memory unit for storing data to be operated, data corresponding to an operation result, or an address of the data to be operated; and a bus interface which is coupled between the core unit and the cache memory unit, and transfers data between the core unit and the cache memory unit. The semiconductor memory may be a part of the cache memory unit within the processor.

The electronic device may further include a processing system. The processing system may include a processor for interpreting a received command, and controlling an operation of information according to an interpreting result of the command; an auxiliary memory device for storing a program for interpreting the command and the information; a main memory device for importing and storing the program and the information from the auxiliary memory device such that the processor may perform the operation using the program and the information when the program is executed; and an interface device for performing communication between one or more of the processor, the auxiliary memory device and the main memory device and an outside. The semiconductor memory may be a part of the auxiliary memory device or the main memory device within the processing system.

The electronic device may further include a data storage system. The data storage system may include a storage device for storing data and retaining the stored data regardless of a power supply; a controller for controlling data input/output of the storage device according to a command input from an outside; a temporary storage device for temporarily storing the data which is exchanged between the storage device and the outside; and an interface for performing communication between one or more of the storage device, the controller and the temporary storage device and the outside. The semiconductor memory may be a part of the storage device or the temporary storage device within the data storage system.

The electronic device may further include a memory system. The memory system may include a memory for storing data and retaining the stored data regardless of a power supply; a memory controller for controlling data input/output of the memory according to a command input from an outside; a buffer memory for buffering the data which is exchanged between the memory and the outside; and an interface for performing communication between one or more of the memory, the memory controller and the buffer memory and the outside. The semiconductor memory may be a part of the memory or the buffer memory within the memory system.

In yet another embodiment, an electronic device may include a semiconductor memory. The semiconductor memory may include a cell array having a plurality of resistive storage cells which are arranged in rows and columns, the cell array divided into a plurality of pages based on the plurality of resistive storage cells, each page including a portion of the plurality of resistive storage cells; and a plurality of sense amplifiers which are corresponding to one page among the plurality of pages and sense data of resistive storage cells included a corresponding page, wherein in a read operation, the semiconductor memory continuously senses a part of or all of the plurality of the resistive storage cells in a selected page in row units in a period in which the selected page of the plurality of pages is activated.

The period in which the selected page is activated may be a period in which one or more sense amplifiers corresponding to the selected page among the plurality of sense amplifiers are activated.

When two or more read operations may continuously perform, and the same page may be selected in the two or more read operations, the selected page may be maintained as an activation state until the last read operation of the two or more read operations may be terminated from start of a first read operation of the two or more read operations.

DETAILED DESCRIPTION

Figure 1:
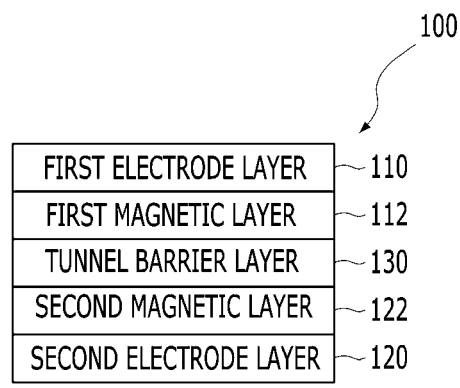
FIG. 1 is a diagram illustrating an example of a magnetic tunnel junction which is any one of structures having a tunnel barrier layer interposed between two magnetic layers in accordance with an embodiment.

The disclosed technology in this patent document can be implemented in various embodiments described below in more detail with reference to the accompanying drawings. The disclosed embodiments are examples only and may be in different forms and thus the disclosed technology should not be construed as limited to the embodiments set forth herein.

In an embodiment, a semiconductor device may include a variable resistance element, and hereinafter, the variable resistance element may represent a variable resistance characteristic, and include a single-layered structure or a multi-layered structure. For example, the variable resistance element may include a chalcogenide-based compound, a transition metal compound, a ferroelectric, a ferromagnetic and so on which are used in an resistive random access memory (RRAM), a phase change random access memory (PRAM), an magnetic random access memory (MRAM), an ferroelectric random access memory (FRAM) and so on. However, the implementations of the disclosed technology are not limited to such an example, the variable resistance element may include another suitable material having a desired variable resistance characteristic and can be switched between different resistance states in response to a current or voltage applied to both terminals of the variable resistance element.

In some implementations, the variable resistance element may include, for example, a metal oxide. The metal oxide may be a transition metal oxide such as a nickel (Ni) oxide, a titanium (Ti) oxide, a hafnium (Hf) oxide, a zirconium (Zq) oxide, a tungsten (W) oxide, a cobalt (Co) oxide, or a perovskite-based material such as a STO (SrTiO) or a PCMO (PSCaMnO). Such the variable resistance element may exhibit different resistance states and can be switched between the different resistance states in connection with a generation/extinction of a current filament by behavior of vacancy.

In other implementations, the variable resistance element may include a phase change material. The phase change material may be a chalcogenide-based material such as a GST (Ge—Sb—Te) and so on. Such the variable resistance element may be switched between different resistance states in connection with being stabilized to one of a crystalline state and an amorphous state through heating or cooling.

In yet further implementations, the variable resistance element may include a structure in which a tunnel barrier layer is interposed between two magnetic layers. The magnetic layer may be formed of a ferromagnetic material or materials (e.g., a NiFeCo, a CoFe), and the tunnel barrier layer may be formed of a suitable barrier material such as $Al_2O_3$. Such a variable resistance element may be switched between different resistance states according to the relative magnetization directions of the two magnetic layers. For example, in one implementation, the variable resistance element may be in a low resistance state when the magnetization directions of two magnetic layers are parallel to each other, and the variable resistance element may be in a high resistance state when the magnetization directions of two magnetic layers are anti-parallel to each other.

FIG. 1 is a diagram illustrating one example of a magnetic tunnel junction which is one of various possible structures having a tunnel barrier layer interposed between two magnetic layers in accordance with an embodiment.

As illustrated in FIG. 1, the magnetic tunnel junction 100 may include a first electrode layer 110 as an upper electrode, a second electrode layer 120 as a lower electrode, a first magnetic layer 112 and a second magnetic layer 122 as a pair of the magnetic layers, and a tunnel barrier layer 130 interposed between the pair of the magnetic layers 112 and 122.

The first magnetic layer 112 may be or include a free ferromagnetic layer of which the magnetization direction is changed according to a current direction applied to the magnetic tunnel junction 100, and the second magnetic layer 122 may be or include a pinned ferromagnetic layer of which the magnetization direction is pinned.

Such a magnetic tunnel junction 100 can exhibits different resistance states or values based on different relative magnetization directions of the first and second magnetic layers 112 and 122 and thus may record data "0" or "1" by changing a resistance value based on the direction and magnitude of the applied current in a writing operation.

Figure 2A:
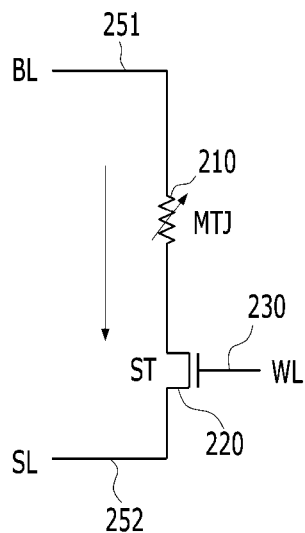
FIGS. 2A and 2B illustrate exemplary operations for storing data in a variable resistance element in accordance with an embodiment.
Figure 2B:
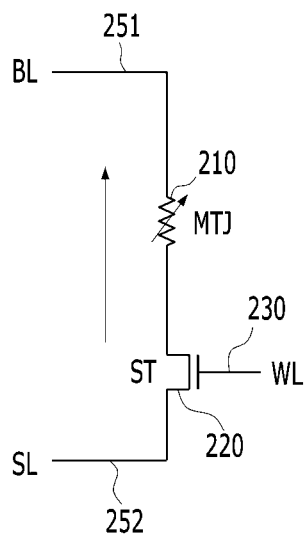

FIGS. 2A and 2B are diagrams illustrating an operations for storing data in a variable resistance element 210 in accordance with an embodiment. The variable resistance element 210 may be, for example, the magnetic tunnel junction 100 in FIG. 1.

FIG. 2A is the diagram illustrating the operation in which data having a logic value of "low" is recorded in the variable resistance element 210. To select the variable resistance element 210 for storing data, when a word line 230 coupled to the variable resistance element 210 is activated, a transistor 220 is turned on. When the current is applied to flow from one end 251 to the other end 252 (as indicated by the arrow direction), that is, from the first electrode layer 110 as the upper electrode to the second electrode layer 120 as the lower electrode of the magnetic tunnel junction 100 in FIG. 1, the magnetization directions of the first magnetic layer 112 which is the free ferromagnetic layer and the second magnetic layer 122 which is the pinned ferromagnetic layer are in parallel. Under this condition, the variable resistance element 210 may be in the low resistance state. It may be defined that "low" data is stored in the variable resistance element 210 when the variable resistance element 210 may be in the low resistance state.

On the other hand, FIG. 2B is the diagram illustrating the operation in which data having a logic value of "high" is recorded in the variable resistance element 210. When the word line 230 coupled to the variable resistance element 210 is activated, the transistor 220 is turned on. When the current is applied to flow from the other end direction 252 to one end direction 251 (as indicated by the arrow direction), that is, from the second electrode layer 120 to the first electrode layer 110, the magnetization directions of the first magnetic layer 112 and the second magnetic layer 122 are anti-parallel or opposite to each other. Under this condition, the variable resistance element 210 may be in the high resistance state. It may be defined that "high" data is stored in the variable resistance element 210 when the variable resistance element 210 may be in the high resistance state.

The logic value of the data stored in the variable resistance element 210 may be changed by changing a resistance value of the variable resistance element 210. When a difference between the resistance value of the variable resistance element 210 in the high resistance state and the resistance value of the variable resistance element 210 in the low resistance state is large, it may be easy to determine whether the data stored in the variable resistance element is in the high or low resistance state at least in part because that this large difference in two resistance values allows the two resistance states to be well separated and distinguished. However, when the difference between the resistance value of the variable resistance element 210 in the high resistance state and the resistance value of the variable resistance element 210 in the low resistance state is relatively small, it may be more difficult to determine whether the data stored in the variable resistance element is in the high or low resistance state at least in part because that this relatively small difference in two resistance values likely increase the probability of a reading error in the data determination. Therefore, it is desirable to provide a circuit mechanism that would reduce the probability of such reading error in the data determination even when the difference between the resistance value of the variable resistance element 210 in the high resistance state and the resistance value of the variable resistance element 210 in the low resistance state is small.

Figure 3:
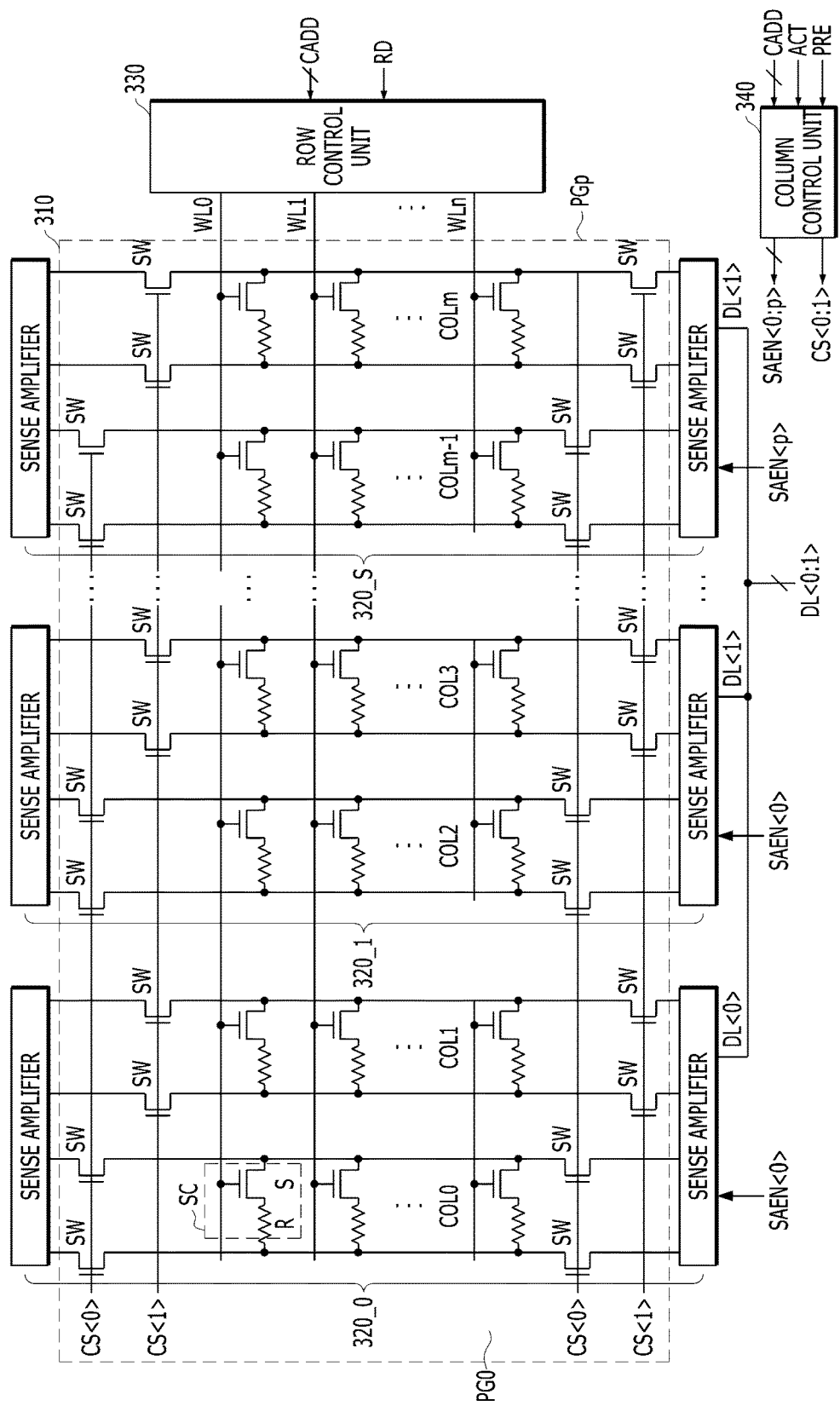
FIG. 3 is a configuration diagram illustrating an example of a memory circuit (device) including a variable resistance element in accordance with an embodiment.

FIGS. 3 and 7 are configuration diagrams illustrating an example of a memory circuit (device) including the variable resistance element as described above in accordance with an embodiment to provide a circuit mechanism that would reduce the probability of such reading error in the data determination.

FIG. 3 is the configuration diagram illustrating the memory circuit (device) including the variable resistance element as part of a memory cell of a cell array 310 of such memory cells.

Referring to FIG. 3, the memory circuit (device) may include the cell array 310, a plurality of sense amplifiers 320_0 to 320_m, a row control unit 330, and a column control unit 340. The following description of FIG. 3 is focused on the read operation while omitting the write operation of the memory circuit (device).

The cell array 310 may include a plurality of word lines WL0 to WLn (n is a natural number), a plurality of bit lines BL0 to BLm (m is a natural number), a plurality of source lines SL0 to SLm, and a plurality of resistive storage cells SC. Each of the resistive storage cell SC may be coupled between a corresponding bit line and a corresponding source line among the plurality of bit lines BL0 to BLm and the plurality of source lines SL0 to SLm, and coupled to a corresponding word line among the plurality of word lines WL0 to WLn. One bit line, one source line, and one resistive storage cell coupled between the bit line and the source line may constitute a column, and the cell array 310 may include a plurality of columns COL0 to COLm. Each of the word line WL0 to WLn may constitute a row.

Each resistive storage cell SC may include a variable resistance element R and a selection element S which is coupled to the variable resistance element R in series. The variable resistance element R may be in the low resistance state when "low" data is stored, and the variable resistance element R may be in the high resistance state when "high" data is stored. The variable resistance element R may be in the low resistance state when the "high" data is stored, and the variable resistance element R may be in the high resistance state when the "low" data is stored. A read operation of the memory circuit is described below as an example.

The plurality of sense amplifiers 320_0 to 320_s (s is an integer number equal to or less than an integer number m)

may correspond to one or more columns, and sense data of a selected resistive storage cell of a selected column among the corresponding columns in an activated state. The plurality of sense amplifiers 320_0 to 320_s may be activated in response to a corresponding enable signal SAEN<0:p> among a plurality of enable signals SAEN<0:p> (p is a natural number equal to or less than s). The selected resistive storage cell SC may represent the resistive storage cell SC which is coupled to an activated word line of the plurality of word lines WL0 to WLn.

An example that one sense amplifier corresponds to two columns is illustrated in FIG. 3. Each column may be coupled to a corresponding the sense amplifier through a switch SW. The switch SW may be turned on when a corresponding column selection signal CS<0:1> is activated.

The plurality of sense amplifiers 320_0 to 320_s may allow a read current to flow in the selected resistive storage cell SC of the selected column, and sense the data of the resistive storage cell SC according to the current amount of the read current. The current amount of the read current which flows in the resistive storage cell SC when the variable resistance element included in the resistive storage cell SC is in the low resistance state may be larger than the current amount of the read current which flows in the resistive storage cell SC when the variable resistance element included in the resistive storage cell SC is in the high resistance state.

The row control unit 330 may active-precharge the word line WL0 to WLn corresponding to a row address RADD when a read signal RD is activated. The active-precharge may represent an operation which activates the word line and then precharges the activated word line after at a predetermined time. The read signal RD may be a signal which is activated for performing the read operation when a read command is applied.

The column control unit 340 may activate an enable signal and a column selection signal corresponding to a column address CADD among the enable signals SAEN<0:p> and the column selection signals CS<0:1> when an active signal ACT is activated. A page in which the enable signal corresponding thereof a plurality of pages PG0 to PGp is activated may be selected, and a column corresponding to an activated column selection signal among columns corresponding to the sense amplifiers included in a selected page may be selected. The column control unit 340 may inactivate an activated enable signal when a precharge signal PRE is activated. The active signal ACT may be a signal which is activated for performing an active operation when an active command is applied to the memory circuit (device), and the precharge signal PRE may be a signal which is activated for performing a precharge operation when a precharge command is applied.

The page may be a unit which includes the columns corresponding to one or more sense amplifiers. Generally, the page may refer to a set of the resistive storage cells which may be accessed through a relatively short access time in the read operation or a write operation in the cell array. One page which includes four columns corresponding to two sense amplifiers in the memory device (circuit) is illustrated in FIG. 3. A more detailed description of the page is provided in the later part of this document.

Hereinafter, the read operation of the memory circuit (device) is described.

In the reading operation when the active signal ACT is activated, the page (for example, PG0) to be accessed of the plurality of pages PG0 to PGp may be selected by the column address CADD, and the enable signal (for example, SAEN<0>) corresponding to the selected page PG0 may be activated. Also, the columns to be accessed in the selected page may be selected, and the column selection signal (for example, CS<0>) corresponding to the selected columns (for example, COL0 and COL2) may be activated. Each page (p=m/4) including four columns is illustrated in FIG. 3. After the enable signal SAEN<0> is activated, when the read signal RD is activated, the word line WL0 corresponding to the row address RADD may be active-precharged.

In the operation which reads all data of the page (hereinafter, a page read operation) after the page is selected, the plurality of word lines WL0 to WLn may be sequentially active-precharged. The enable signals SAEN<0> may be maintained as the activation state when the plurality of word lines WL0 to WLn are sequentially active-precharged. Also, even in the general read operation, when all of two or more continuous read operations perform in the selected page, the enable signals (for example, SAEN<0>) may be maintained as the activation state when each of two or more word line is active-precharged.

When the enable signal corresponding to the selected page is activated, a corresponding page is selected and activated. The column selection signal corresponding to the selected column may be equally controlled with the enable signal corresponding to the selected page.

The sense amplifiers 320_0 and 320_1 activated in a region in which the word line is activated may sense the data of the selected resistive storage cells SC, and transfer the sensed data to data lines DL<0:1>. At this time, the number of the data lines DL<0:1> may be the same as the number of data which is sensed when one word line in one page is active-precharged (for example, 2). The data lines DL<0:1> may receive the sensed data in the selected page from the sense amplifiers in the read operation, and transfer the received data to a data output path (not illustrated in FIG. 3). When the read operation of the selected page PG0 is completed, the activated enable signal SAEN<0> may be deactivated.

One page including four columns is illustrated in FIG. 3. In implementations, the page may include various numbers of columns (e.g., less or more than four) based on the specific designs needed for the memory devices. For example, one page may include eight or sixteen columns in some circuits based on the disclosed technology, or the page may include columns more than sixteen in other circuits based on the disclosed technology.

Figure 4A:
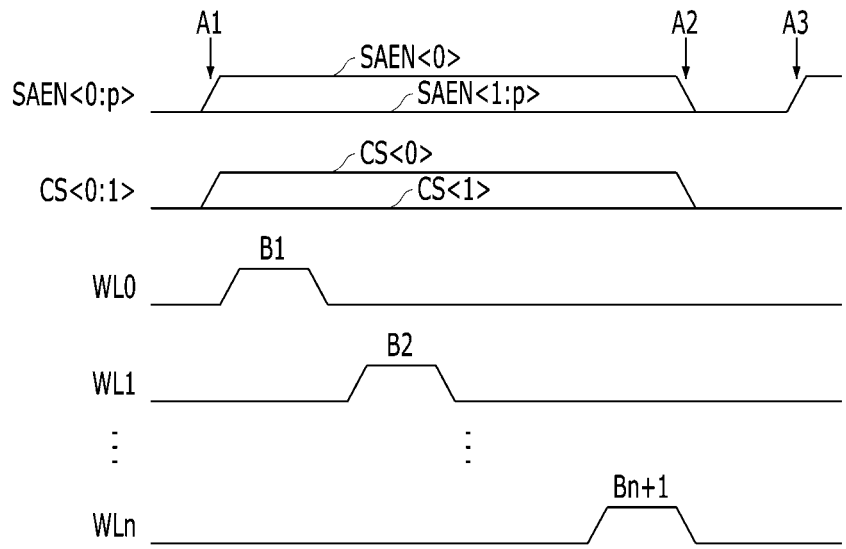
FIGS. 4A and 4B are waveform diagrams illustrating an example of a read operation of the memory circuit (device) in FIG. 3.
Figure 4B:
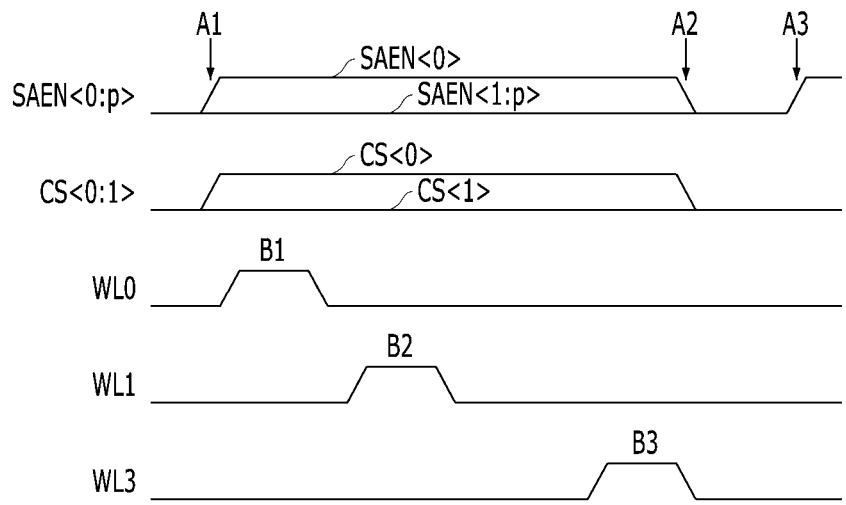

FIGS. 4A and 4B are examples of waveform diagrams illustrating a read operation of the memory circuit (device) in FIG. 3. FIG. 4A is the waveform diagram illustrating a page read operation, and FIG. 4B is the waveform diagram illustrating the operation of reading two or more word lines in state which one page is selected.

Referring to FIG. 4A, when a page is selected, the enable signal SAEN<0> corresponding to the selected page PG0 and the column selection signal CS<0> corresponding to the selected columns COL0 and COL2 may be activated (A1). Next, the plurality of word lines WL0 to WLn may be sequentially active-precharged (B1 to Bn+1). The enable signal SAEN<0> and the column selection signal CS<0> in which the page read operation is performed may be maintained as the activation state, and when the page read operation is completed, the enable signal SAEN<0> and the column selection signal CS<0> may be inactivated (A2), and the other page (for example, PG1) may be selected (A3).

In the example of the read operation sequence shown in FIG. 4B, the enable signal SAEN<0> corresponding to the selected page PG0 and the column selection signal CS<0> corresponding to the selected columns COL0 and COL2 may be activated (E1) first. Next, two or more row addresses RADD may be input to the row control unit 330 when the read signal RD is activated, and two or more word lines (for example, WL0, WL2, and WL4) corresponding to the row addresses RADD among the plurality of word lines WL0 to WLn may be sequentially active-precharged (B1, B2, and B3). The enable signal SAEN<0> may be maintained as the activation state when the read operation is performed in the selected page. When the read operation is completed in the selected page, the enable signal SAEN<0> and the column selection signal CS<0> may be inactivated (A2), the other page (for example, PG1) may be selected (A3).

The example that the selected columns COL0 and COL2 do not change in the state which the page is selected is illustrated in FIG. 4B. However, the read operation may be performed by changing only the column in the state which the page is selected.

Figure 5:
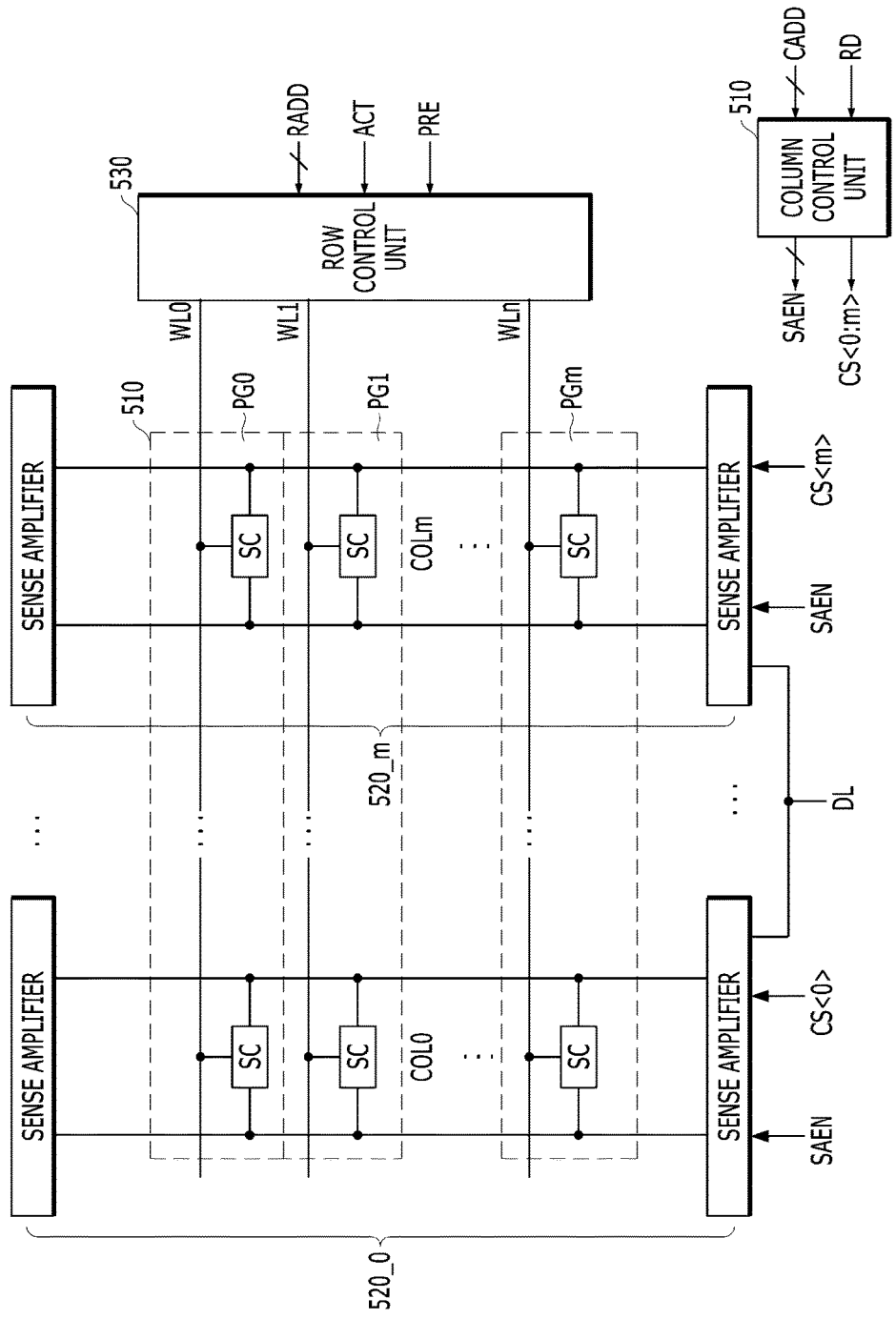
FIG. 5 is a configuration diagram illustrating an example of a memory circuit (device) which performs read in a page unit different with the memory circuit (device) in FIG. 3 in accordance with an embodiment.

FIG. 5 is a configuration diagram illustrating an example of a memory circuit (device) which performs read in a page unit different with the memory circuit (device) in FIG. 3 in accordance with an embodiment.

Referring to FIG. 5, the memory circuit (device) may include a cell array 510, a plurality of sense amplifiers 520_0 to 520_m, a row control unit 530, and a column control unit 540.

The plurality of sense amplifiers 520_0 to 520_m may correspond to one column, and sense and output data of selected resistive storage cell SC. The plurality of sense amplifiers 520_0 to 520_m may be activated in response to an enable signal SAEN. The enable signal SAEN may be activated and inactivated in a similar time to activation and precharge of a word line.

The row control unit 530 may activate the word line WL0 to WLn corresponding to a row address RADD and activate the enable signal SAEN when an active signal ACT is activated. Also, the row control unit 530 may precharge the activated word line and inactivate the enable signal SAEN when a precharge signal PRE is activated.

The column control unit 540 may activate a column selection signal corresponding to a column address CADD among column selection signals CS<0:m> when a read signal RD is activated. Sense amplifiers corresponding to the activated column selection signal CS<0> may output sensed data to a data line DL.

The page of the memory circuit (device) in FIG. 5 may be a unit which includes storage cells SC coupled to one word line.

Figure 6:
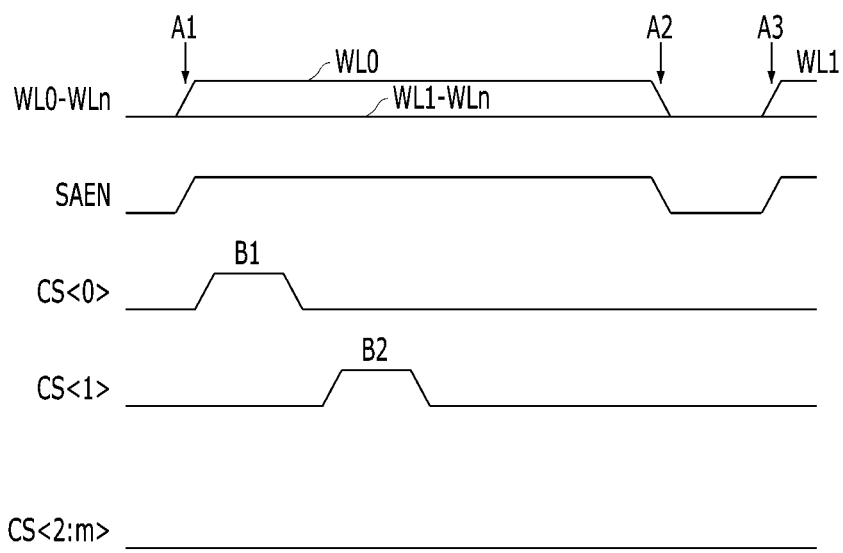
FIG. 6 is a waveform diagram illustrating an example of a read operation of the memory circuit (device) in FIG. 5.

FIG. 6 is a waveform diagram illustrating an example of a read operation of the memory circuit (device) in FIG. 5.

Referring to FIG. 6, when a word line (page) is selected, a selected word line (for example, WL0) is activated, and the enable signal SAEN may be activated (A1). In this state, when the column address CADD is input with the read signal RD, column selection signals (for example, CS<0> and CS<1>) corresponding to the column address CADD may be activated, and thus data of the selected storage cell SC may be output (B1 and B2). When the read operation of the selected word line WL0 is completed, the word line WL0 may be precharged, and the enable signal SAEN may be inactivated (A2). Then, the other word line (page)(for example, WL1) may be selected (A3).

In FIG. 3, the page may be an array including the resistive storage cells SC which is included in four columns, and in FIG. 5, the page may be the array including the resistive storage cells SC coupled to one word line. A large size of the page is advantageous for a high speed operation because when each other page is accessed, the operation is delayed since of an operation for activating the enable signal.

In the memory circuit (device) in FIG. 5, one page is configured of the resistive storage cells coupled to one word line. Therefore, the number of resistive storage cells SC coupled the word line is increased to expand the page, and thus, the number of sense amplifiers is increased. That is, it is difficult to expand the page. Also, even when any page is accessed, since all sense amplifiers are activated, large current consumption and noise are caused.

On the other hand, since one page includes the resistive storage cells SC coupled to the plurality of columns in the memory circuit (device) of FIG. 3, it is possible to expand the page by adding existing columns. That is, the page expansion is easy, and thus, it is possible to constitute a larger page than the memory circuit (device) in FIG. 5. Also, when one page is accessed, since only the sense amplifiers corresponding to page are activated, the current consumption and noise are small.

Figure 7A:
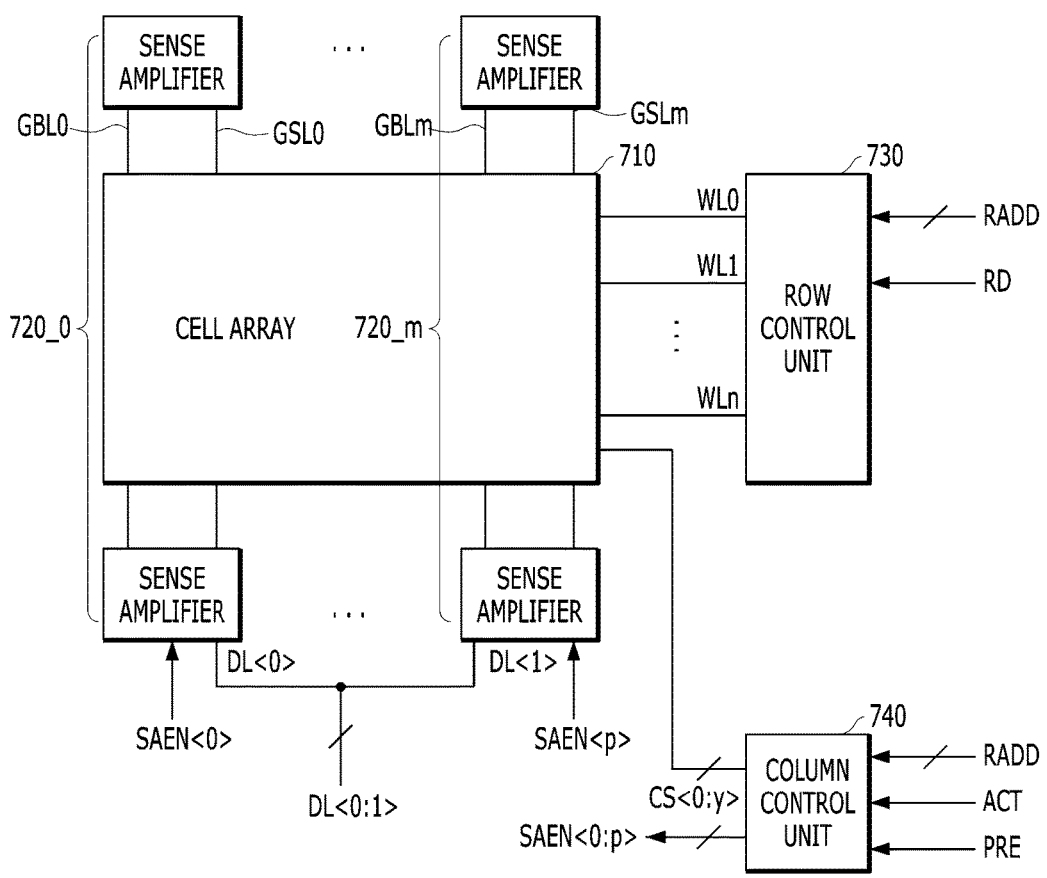
FIGS. 7A and 7B are circuit configuration diagrams illustrating an example of a memory circuit (device) including a variable resistance element in accordance with an embodiment.
Figure 7B:
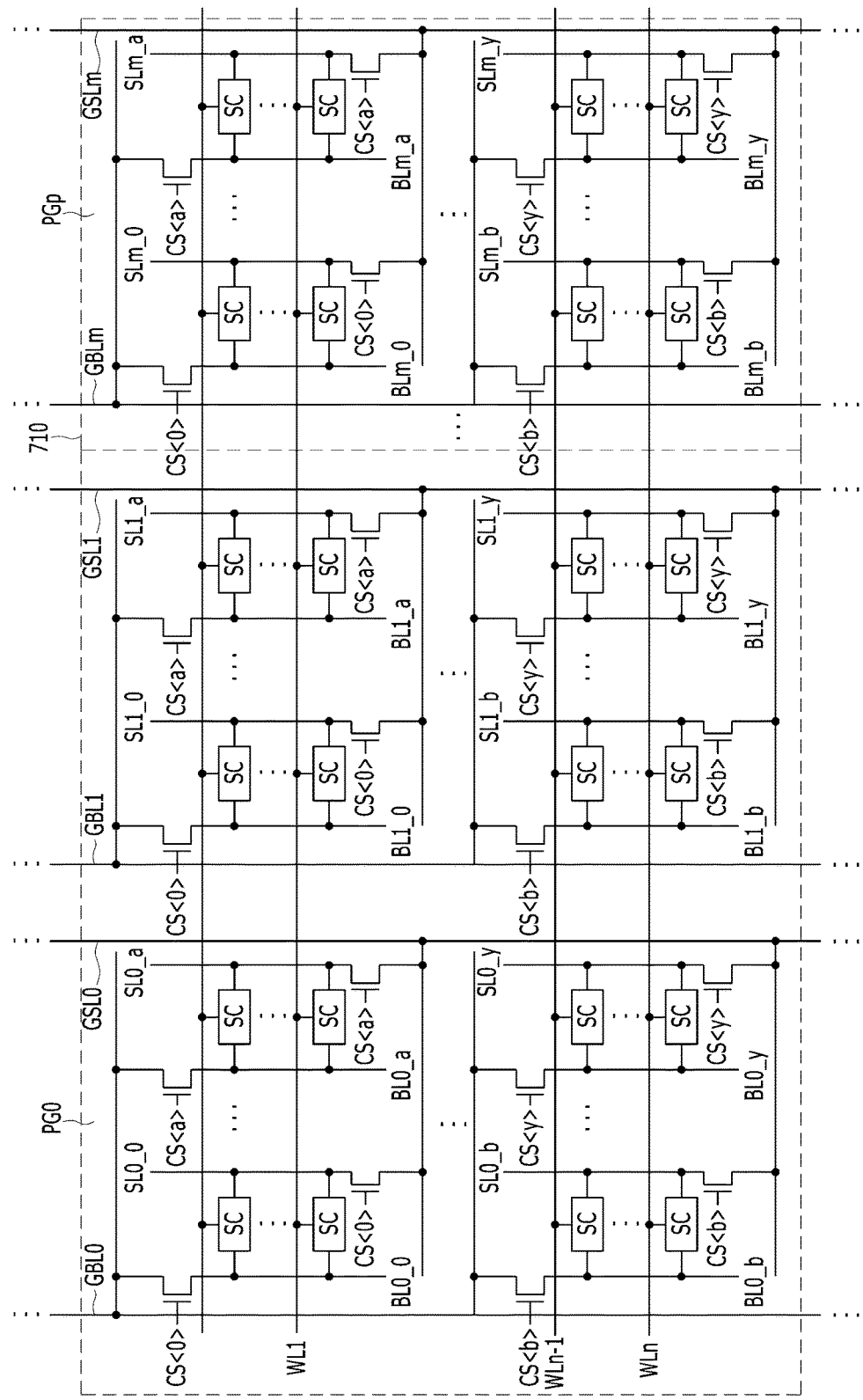

FIGS. 7A and 7B are configuration diagrams illustrating an example of a memory circuit (device) including a variable resistance element in accordance with an embodiment.

Referring to FIG. 7A, the memory circuit (device) may include a cell array 710, a plurality of sense amplifiers 720_0 to 720_m, a row control unit 730, and a column control unit 740. A configuration diagram for describing a write operation of the memory circuit (device) in FIG. 7A will be omitted.

Referring to FIG. 7B, the cell array 710 may include a zeroth to a mth global line pairs GBL0/GSL0 to GBLm/GSLm, a plurality of a zeroth to a mth local line pairs BL0_0/SL0_0 to BL0_y/SL0_y, . . . , BLm_0/SLm_0 to BLm_y/SLm_y (y is a natural number), a plurality of word lines WL0 to WLx (x is a natural number), and a plurality of resistive storage cells SC coupled to the local line pairs and a word line. The zeroth to the mth global line pairs GBL0/GSL0 to GBLm/GSLm may include a zeroth to a mth global bit lines GBL0 to GBLm and a zeroth to a mth global source lines GSL0 to GSLm. The plurality of the zeroth to the mth local line pairs BL0_0/SL0_0 to BL0_y/SL0_y, . . . , BLm_0/SLm_0 to BLm_y/SLm_y may include a plurality of a zeroth to a mth bit lines BL0_0 to BL0_y, . . . , BLm_0/BLm_y and a plurality of a zeroth to a mth source lines SL0_0 to SL0_y, . . . , SLm_0/SLm_y.

A zeroth to a mth of sense amplifiers 720_0 to 720_m may correspond to the zeroth to the mth global line pairs GBL0/GSL0 to GBLm/GSLm, and sense data of selected resistive storage cell by allowing a read current to flow to the corresponding global line pairs in the activated state.

The plurality of the zeroth to the mth local line pairs BL0_0/SL0_0 to BL0_y/SL0_y, . . . , BLm_0/SLm_0 to BLm_y/SLm_y (y is a natural number) may correspond to the zeroth to the mth global line pairs GBL0/GSL0 to GBLm/GSLm, and be coupled to the corresponding global line pairs through switches SW. The switch SW which couples each of the local line pairs and each of the global line pairs may electrically couple the corresponding local line pairs and the corresponding global line pairs when the corresponding column selection signal among a plurality of column selection signals CS<0:y> is activated.

Since the read current may flow in the selected resistive storage cell corresponding to activated word line among the resistive storage cells SC of the local line pairs coupled electrically to the global line pairs, the sense amplifier may sense the data of the selected resistive storage cell SC in the activated state. The zeroth to the mth sense amplifiers 720_0 to 720_m may be activated in response to a enable signal SAEN<0:p> corresponding thereof a plurality of enable signals SAEN<0:p>.

The row control unit 730 may active-precharge the word line WL0 to WLn corresponding to a row address RADD when a read signal RD is activated. The active-precharge may represent an operation which activates the word line and then precharges the activated word line after at a predetermined time. The read signal RD may be a signal which is activated for performing the read operation when a read command is applied.

The column control unit 740 may activate an enable signal and a column selection signal corresponding to the column address CADD among the enable signals SAEN<0:p> and the column selection signals CS<0:y> when an active signal ACT is activated. A page in which the enable signal corresponding thereof a plurality of pages PG0 to PGp is activated may be selected, and a column corresponding to an activated column selection signal among columns corresponding to the sense amplifiers included in a selected page may be selected. The column control unit 740 may inactivate an activated enable signal when a precharge signal PRE is activated.

The page may be a unit and includes the global line pairs corresponding to one or more sense amplifiers. One page including two global line pairs corresponding to two sense amplifiers is illustrated in FIG. 7A.

Hereinafter, the read operation of the memory circuit (device) is described.

When the active signal ACT is activated, the page (for example, PG0) to be accessed of the plurality of pages PG0 to PGp may be selected by the column address CADD, and the enable signal (for example, SAEN<0>) corresponding to the selected page PG0 may be activated. Also, the local line pairs to be accessed in the selected page may be selected, and the column selection signal (for example, CS<0>) corresponding to the selected the local line pairs (for example, BL0_0/SL0_0 and BLI_0/SL1_0) may be activated. After the enable signal SAEN<0> is activated, when the read signal RD is activated, the word line (for example, WL0) corresponding to the row address RADD may be active-precharged.

In the operation which reads all data of the page (hereinafter, a page read operation), after the page is selected, the plurality of word lines WL0 to WLn may be sequentially active-precharged. The enable signals SAEN<0> may be maintained as the activation state when the plurality of word lines WL0 to WLn are sequentially active-precharged. Also, even in the general read operation, when all of two or more continuous read operations perform in the selected page, the enable signals (for example, SAEN<0>) may be maintained as the activation state when each of two or more word line is active-precharged.

The sense amplifiers 720_0 and 720_s activated in a region in which the word line is activated may sense the data of the selected resistive storage cells SC, and transfer the sensed data to data lines DL<0:1>. At this time, the number of the data lines DL<0:1> may be the same as the number of data which is sensed when one word line in one page is active-precharged (for example, 2). The data lines DL<0:1> may receive the sensed data in the selected page from the sense amplifiers in the read operation, and transfer the received data to a data output path (not illustrated in FIG. 3). When the read operation of the selected page PG0 is completed, the activated enable signal SAEN<0> may be inactivated.

One page including 2y local line pairs is illustrated in FIG. 7A. However, the page may include the local line pairs more than or less than 2y according to the design.

The memory circuit or the semiconductor device as described above may be used in various devices or systems. Some of devices or systems which may be implemented with the memory circuit or the semiconductor device as described above are illustrated in FIGS. 8 to 12.

Figure 8:
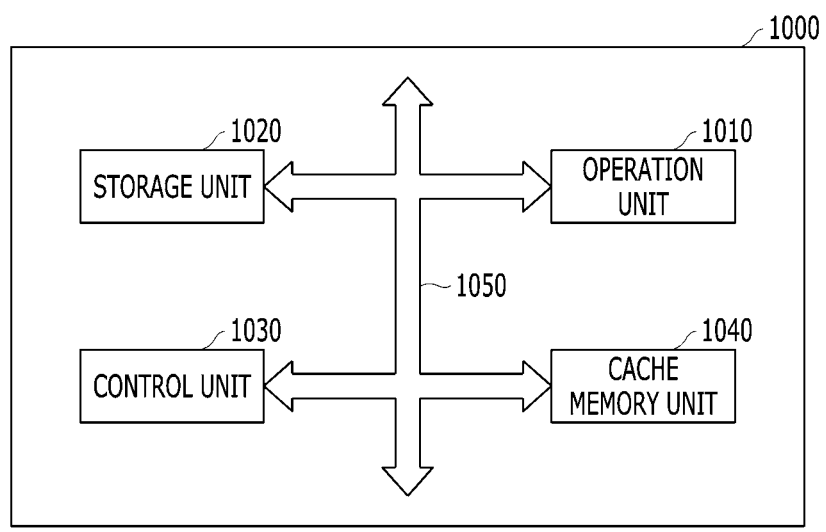
FIG. 8 is a configuration diagram illustrating an example of a microprocessor which is implemented with a memory device in accordance with an embodiment.

FIG. 8 is a configuration diagram illustrating an example of a microprocessor which is implemented with a memory device in accordance with an embodiment.

Referring to FIG. 8, a microprocessor 1000 may control and adjust a series of processes which receives data from various external devices, processes the data, and then sends a result to the external devices. The microprocessor 1000 may include a storage unit 1010, an operation unit 1020, a control unit 1030 and so on. The microprocessor 1000 may be various data processing devices such as a central processing unit (CPU), a graphic processing unit (GPU), a digital signal processor (DSP), an application processor (AP) and so on.

The storage unit 1010 may be a processor register, a register and so on, and be a part for storing the data in the microprocessor 1000. The storage unit 1010 may include a data register, an address register, a floating-point register, other various registers and so on. The storage unit 1010 may serve to temporarily store the data for performing an operation, the operation result data in the operation unit 1020, and an address in which the data is stored to be performed.

The storage unit 1010 may include one or more of the embodiments of the memory device as described above. For example, the storage unit 1010 may include a plurality of word lines; and a plurality of columns having a plurality of resistive storage cells corresponding to the plurality of word lines, wherein the plurality of columns are divided into a plurality of pages each having one or more columns. In a read operation, the semiconductor memory may sense data of resistive storage cells included in a selected page by continuously active-precharging one or more word lines among the plurality of word lines in a period in which the selected page among the plurality of pages is activated, and thus a read operation speed of the storage unit 1010 may be increased. As a result, and the performance of the microprocessor 1000 may be improved.

The operation unit 1020 may perform a number of arithmetic and logical operations according to a result of decoding a command by the control unit 1030. The operation unit 1020 may include one or more arithmetic and logic units (ALU) and so on.

The control unit 1030 may receive a signal from the storage unit 1010, the operation unit 1020, an external device of the microprocessor 1000 and so on, and perform extraction or decode of the command, signal input/output control of the microprocessor 1000 and execute the processing which is represented by the program.

The microprocessor 1000 in accordance with the embodiment may further include a cache memory unit 1040 which may temporarily store data to be output to the external device or is input from the external device in addition to the storage unit 1010. The cache memory unit 1040 may exchange the data with the storage unit 1010, the operation unit 1020 and the control unit 1030 through a bus interface 1050.

Figure 9:
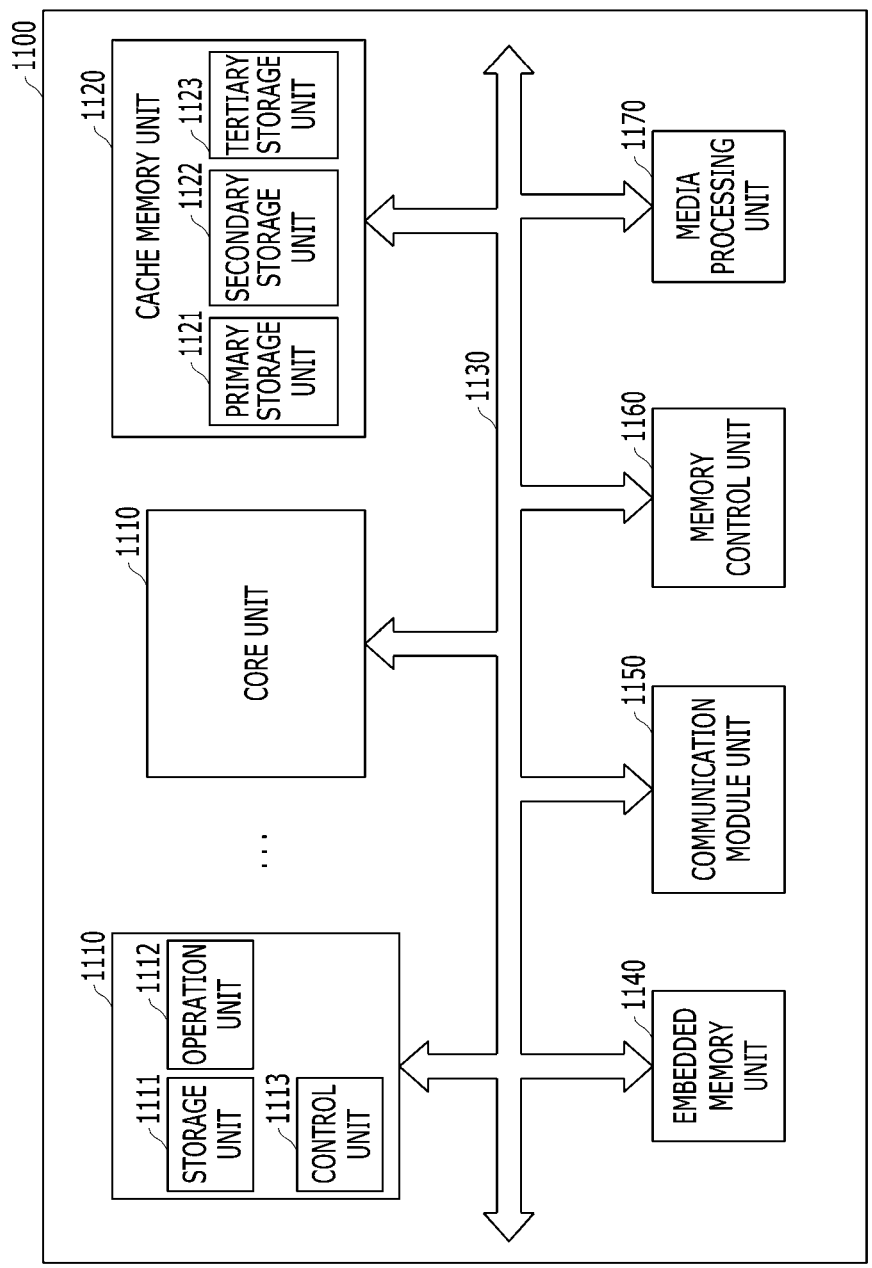
FIG. 9 is a configuration diagram illustrating an example of a processor which is implemented with a memory device in accordance with an embodiment.

FIG. 9 is a configuration diagram illustrating an example of a processor which is implemented with a memory device in accordance with an embodiment.

Referring to FIG. 9, a processor 1100 may improve performance and implement multi functions by including various functions in addition to a function of the microprocessor that control and adjust a series of processes which receives data from various external devices, processes the data, and then sends a result to the external devices. The processor 1100 may include a core unit 1110 serving as the microprocessor, a cache memory unit 1120 for temporarily storing data and a bus interface 1130 for transferring the data between an internal device and the external device. The processor 1100 may include a variety of system on chips (SoC) such as a multi core processor, a graphic processing unit (GPU), an application processor (AP) and so on.

The core unit 1110 may be a part for arithmetic and logic operating data input from the external device, and may include a storage unit 1111, an operation unit 1112 and a control unit 1113.

The storage unit 1111 may be a processor register, a register and so on, and be a part for storing the data in the processor 1100. The storage unit 1111 may include a data register, an address register, a floating-point register, other various registers and so on. The storage unit 1111 may serve to temporarily store the data for performing an operation, the operation result data in the operation unit 1112, and an address in which the data is stored to be performed. The operation unit 1112 is a part of performing the operation within the processor 1100, and may perform a number of arithmetic and logical operations according to a result of decoding a command by the control unit 1113. The operation unit 1112 may include one or more arithmetic and logic units (ALU) and so on. The control unit 1113 may receive a signal from the storage unit 1111, the operation unit 1112, the external device of the processor 1100 and so on, and perform extraction or decode of the command, signal input/output control of the processor 1111 and execute the processing which is represented by the program.

The cache memory unit 1120 is a part of temporarily storing data to compensate the data processing speed difference between the core unit 1110 which operates at high speed and the external device which operates at low speed. The cache memory unit 1120 may include a primary storage unit 1121, a secondary storage unit 1122, and a tertiary storage unit 1123. Generally, the cache memory unit 1120 may include the primary storage unit 1121 and the secondary storage unit 1122, and when high capacity is needed, the cache memory unit 1120 may include the third storage unit 1123. The cache memory unit 1120 may include more storage units as required. That is, the number of storage units which is included in the cache memory may depend on the design. The speeds for storing and determining data in the primary, the secondary and the tertiary storage units 1121, 1122 and 1123 may be the same as each other or be different from each other. When processing speeds of the storage units are different, a speed of the primary storage unit may be fastest. One or more storage units among the primary storage unit 1121, the secondary storage unit 1122 and the tertiary storage unit 1123 of the cache memory unit 1120 may include one or more of the embodiments of the memory devices as described above. For example, the cache memory unit 1120 may include a plurality of word lines; and a plurality of columns having a plurality of resistive storage cells corresponding to the plurality of word lines, wherein the plurality of columns are divided into a plurality of pages each having one or more columns. In a read operation, the semiconductor memory may sense data of resistive storage cells included in a selected page by continuously active-precharging one or more word lines among the plurality of word lines in a period in which the selected page among the plurality of pages is activated, and thus a read operation speed of the cache memory unit 1120 may be increased. As a result, and the performance of the processor 1100 may be improved.

FIG. 9 is the configuration diagram illustrating all of the primary, the secondary and the tertiary storage units 1121, 1122 and 1123 are configured within the cache memory unit 1120. However, all of the primary, the secondary and the tertiary storage units 1121, 1122 and 1123 of the cache memory unit 1120 are configured in the outside of the core unit 1110, and the processing speed difference may be compensated between the core unit 1110 and the external device. Also, the primary storage unit 1121 of the cache memory unit 1120 may be configured within the core unit 1110, and the secondary and the tertiary storage units 1122 and 1123 may be configured in the outside of the core unit 1110, and the complementary function of the processing speed difference may be enhanced. Also, the primary and the secondary storage units 1121 and 1122 may be configured within the core unit 1110, and the tertiary storage unit 1123 may be configured in the outside of the core unit 1110.

The bus interface 1130 is a part which allows data to be efficiently transmitted by coupling the core unit 1110, the cache memory unit 1120 and the external device.

The processor 1100 may include a plurality of the core units 1110, and the plurality of the core units 1110 may share the cache memory unit 1120. The plurality of the core units 1110 and the cache memory unit 1120 may be coupled directly, or may be coupled through the bus interface 1130. All of the plurality of the core units 1110 may have the same configuration as the core unit as described above. When the processor 1100 includes the plurality of the core units 1110, the primary storage unit 1121 of the cache memory unit 1120 may correspond to the number of a plurality of the core units 1110 and the primary storage unit 1121 may be configured in each of the core unit 1110, and the secondary and the tertiary storage units 1122 and 1123 may be configured in the outsides of the plurality of the core units 1110 to be shared through the bus interface 1130. Herein, the processing speed of the primary storage unit 1121 may be faster than the processing speeds of the secondary and the tertiary storage units 1122 and 1123. In the other embodiment, the primary storage unit 1121 and the secondary storage units 1122 may correspond to the number of the plurality of the core units 1110, and may be configured in each of the core unit 1110, the tertiary storage unit 1123 may be configured to be shared through the interface in the outsides of the plurality of the core units 1110.

The processor 1100 may further include an embedded memory unit 1140 for storing data, a communication module unit 1150 for sending and receiving the data with the external device in a wired or wireless manner, a memory control unit 1160 for driving an external storage device, a media processing unit 1170 for processing data processed in the processor 1100 or data input from an external input device and outputting the processed data to the external interface device and so on, and may further include a plurality of modules and devices. The plurality of the modules which are added may exchange the data with the core unit 1110 and the cache memory unit 1120 through the bus interface 1130.

The embedded memory unit 1140 may include a nonvolatile memory as well as a volatile memory. The volatile memory may include a dynamic random access memory (DRAM), a mobile DRAM, a static random access memory (SRAM) and a memory for performing a function similar thereto, and the non-volatile memory may include a read only memory (ROM), a NOR flash memory, a NAND flash memory, a phase change random access memory (PRAM), a resistive random access memory (RRAM), a spin transfer torque random access memory (STTRAM), a magnetic random access memory (MRAM) and the memory for performing the function similar thereto.

The communication module unit 1150 may include a module which may be coupled to a wired network, a module which may be coupled to a wireless network and all of these modules. The module which may be coupled to the wired network may include a local area network (LAN), a universal serial bus (USB), an Ethernet, a power line communication (PLC) and so on as like various devices for sending and receiving the data through a transmission line. The module which may be coupled to the wireless network may include an infrared data association (IrDA), a code division multiple access (CDMA), a time division multiple access (TDMA), a frequency division multiple access (FDMA), a wireless LAN, a zigbee, an ubiquitous sensor network (USN), a bluetooth, a radio frequency identification (RFID), a long term evolution (LTE), a near field communication (NFC), a wireless broadband internet (Wibro), a high speed downlink packet access (HSDPA), a wideband CDMA (WCDMA), an ultra wideband (UWB) and so on as like various devices for sending and receiving the data without a transmission line.

The memory control unit 1160 may process and manage the data which is transmitted between the processor 1100 and the external storage device which operates according to a different communication standard from the processor 1100, and include various controllers for controlling memory controllers such as an integrated device electronics (IDE), a serial advanced technology attachment (SATA), a small computer system interface (SCSI), a redundant array of independent disks (RAID), a solid state disk (SSD), an external SATA (eSATA), a personal computer memory card international association (PCMCIA), an universal serial bus (USB), a secure digital card (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The media processing unit 1170 may process the data which is processed in the processor 1100 or which is input in a video, an audio, and other forms from the external input device, and output the data to the external interface device. The media processing unit 1170 may include a graphics processing unit (GPU), a digital signal processor (DSP), a high definition audio (HD Audio), a high definition multimedia interface (HDMI) controller and so on.

Figure 10:
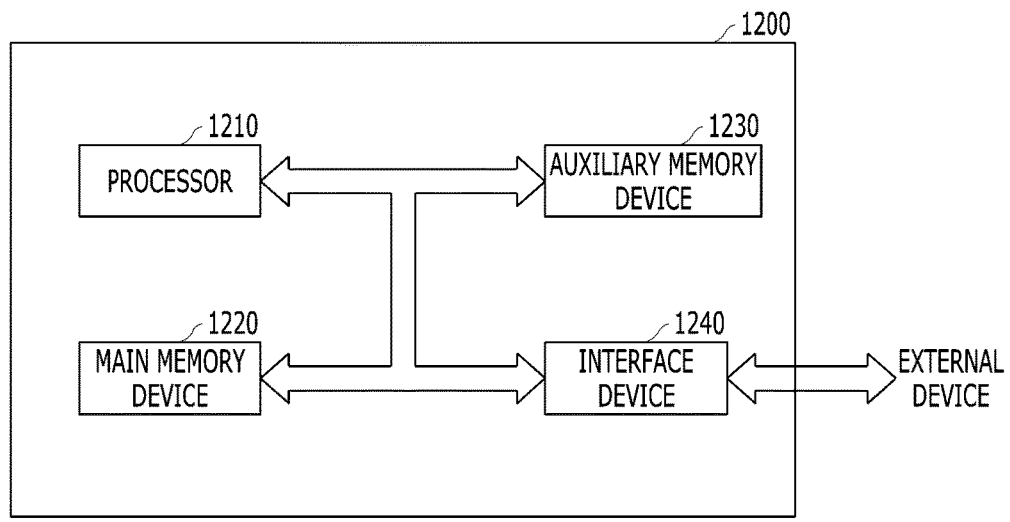
FIG. 10 is a configuration diagram illustrating an example of a system which is implemented with a memory device in accordance with an embodiment.

FIG. 10 is a configuration diagram illustrating an example of a system which is implemented with a memory device in accordance with an embodiment.

Referring to FIG. 10, a system 1200 is a device for processing data, and may perform input, processing, output, communication, storage and so on the data for performing a series of operations. The system 1200 may include a processor 1210, a main memory device 1220, an auxiliary memory device 1230, an interface device 1240 and so on. The system 1200 may be various electronic systems which operate using a process such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, a telematics, an audio visual system, a smart television and so on.

The processor 1210 may control processing such as interpretation of an input command, operation and comparison of the data stored in the system 1200 and so on. The processor 1210 may include a micro processor unit (MPU), a central processing unit (CPU), a single/multi core processor, a graphic processing unit (GPU), an application processor (AP), a digital signal processor (DSP) and so on.

The main memory device 1220 may be a memory device which imports a program code or data from the auxiliary memory device 1230, and stores and execute the program code or the data when the program is performed. Contents which are stored in the main memory device 1220 may be retained when power is interrupted. The main memory device 1220 may include one or more of the embodiments of the memory devices as described above. For example, the main memory device 1220 may include a plurality of word lines; and a plurality of columns having a plurality of resistive storage cells corresponding to the plurality of word lines, wherein the plurality of columns are divided into a plurality of pages each having one or more columns. In a read operation, the semiconductor memory may sense data of resistive storage cells included in a selected page by continuously active-precharging one or more word lines among the plurality of word lines in a period in which the selected page among the plurality of pages is activated, and thus a read operation speed of the main memory device 1220 may be increased. As a result, and the performance of the system 1200 may be improved.

The main memory device 1220 may further include a volatile memory which contents are entirely erased when the power is interrupted, such as a static random access memory (SRAM), a dynamic random access memory (DRAM) and so on. On the other hand, the main memory device 1220 may not include the embodiments of the memory devices as described above, and may include the volatile memory which contents are entirely erased when the power is interrupted, such as the static random access memory (SRAM), the dynamic random access memory (DRAM) and so on.

The auxiliary memory device 1230 may be a memory device for storing data and a program code. A speed of the auxiliary memory device 1230 is slower than the speed of the main memory device 1220, but the auxiliary memory device 1230 may store a lot of data. The auxiliary memory device 1230 may include one or more of the embodiments of the memory devices as described above. For example, the auxiliary memory device 1230 may include a plurality of word lines; and a plurality of columns having a plurality of resistive storage cells corresponding to the plurality of word lines, wherein the plurality of columns are divided into a plurality of pages each having one or more columns. In a read operation, the semiconductor memory may sense data of resistive storage cells included in a selected page by continuously active-precharging one or more word lines among the plurality of word lines in a period in which the selected page among the plurality of pages is activated, and thus a read operation speed of the auxiliary memory device 1230 may be increased. As a result, and the performance of the system 1200 may be improved.

The auxiliary memory device 1230 may further include a data storage system such as a magnetic tape and a magnetic disk using magnetism, a laser disk using light, a magnetic-optical disk using the light and the magnetism, a solid state disk (SSD), an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on. On the other hand, the auxiliary memory device 1230 may not include the embodiments of the memory devices as described above, and may include the data storage system such as the magnetic tape and the magnetic disk using magnetism, the laser disk using light, the magnetic-optical disk using the light and the magnetism, the solid state disk (SSD), the universal serial bus memory (USBM), the secure digital (SD), the mini secure digital card (mSD), the micro (SD), the secure digital high capacity (SDHC), the memory stick card, the smart media card (SM), the multi media card (MMC), the embedded MMC (eMMC), the compact flash (CF) and so on.

The interface device 1240 may exchange a command, data and so on between the system 1200 and the external device, and be a keypad, a keyboard, a mouse, a speaker, a mike, a display, a human interface device (HID), a communication device and so on. The communication device may include a module which may be coupled to a wired network, a module which may be coupled to a wireless network and all of these modules. The module which may be coupled to the wired network may include a local area network (LAN), a universal serial bus (USB), an Ethernet, a power line communication (PLC) and so on as like various devices for sending and receiving the data through a transmission line. The module which may be coupled to the wireless network may include an infrared data association (IrDA), a code division multiple access (CDMA), a time division multiple access (TDMA), a frequency division multiple access (FDMA), a wireless LAN, a zigbee, an ubiquitous sensor network (USN), a bluetooth, a radio frequency identification (RFID), a long term evolution (LTE), a near field communication (NFC), a wireless broadband internet (Wibro), a high speed downlink packet access (HSDPA), a wideband CDMA (WCDMA), an ultra wideband (UWB) as like various devices for sending and receiving the data without a transmission line.

Figure 11:
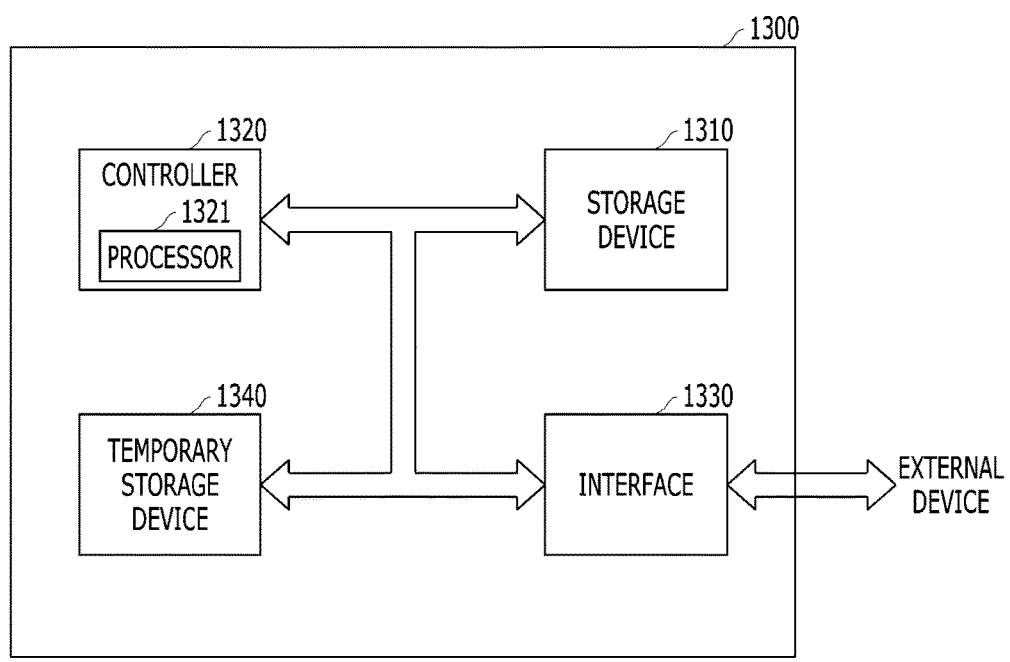
FIG. 11 is a configuration diagram illustrating an example of a data storage system which is implemented with a memory device in accordance with an embodiment.

FIG. 11 is a configuration diagram illustrating an example of a data storage system which is implemented with a memory device in accordance with an embodiment.

Referring to FIG. 11, a data storage system 1300 may include a storage device 1310 for storing data and having a non-volatile characteristic, a controller 1320 for controlling the storage device, an interface 1330 for coupling to an external device and a temporary storage device 1340 for temporarily storing data. The data storage system 1300 may be a disk type such as a hard disk drive (HDD), a compact disc read only memory (CDROM), a digital versatile disc (DVD), a solid state disk (SSD) and so on, and be a card type such as an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The storage device 1310 may include a non-volatile memory which semi-permanently stores data. The non-volatile memory may include a read only memory (ROM), a NOR flash memory, a NAND flash memory, a phase change random access memory (PRAM), a resistive random access memory (RRAM), magnetic random access memory (MRAM) and so on.

The controller 1320 may control exchange of data between the storage device 1310 and the interface 1330. The controller 1320 may include a processor 1321 which performs an operation and so on for processing commands which are input through the interface 1330 from the outside of the data storage system 1300.

The interface 1330 may exchange a command, data and so on between the data storage system 1300 and the external device. When the data storage system 1300 may be the card type, the interface 1330 may be compatible with interfaces which are used in a device such as the universal serial bus memory (USBM), the secure digital (SD), the mini secure digital card (mSD), the micro SD, the secure digital high capacity (SDHC), the memory stick card, the smart media card (SM), the multi media card (MMC), the embedded MMC (eMMC), the compact flash (CF) and so on, or be compatible with interfaces which are used in the device similar thereto. When the data storage system 1300 may be the disk type, the interface 1330 may be compatible with the interfaces such as an integrated device electronics (IDE), a serial advanced technology attachment (SATA), a small computer system interface (SCSI), an external SATA (eSATA), a personal computer memory card international association (PCMCIA), an universal serial bus (USB) and so on, or be compatible with interfaces which are used in the device similar thereto. The interface 1330 may be compatible with one or more interfaces which have different types.

The temporary storage device 1340 may temporarily store data to efficiently transfer the data between the interface 1330 and the storage device 1310 according to diversification and high performance of an interface with the external device, the controller, the system. The temporary storage device 1340 may include one or more of the embodiments of the memory devices as described above. For example, the temporary storage device 1340 may include a plurality of word lines; and a plurality of columns having a plurality of resistive storage cells corresponding to the plurality of word lines, wherein the plurality of columns are divided into a plurality of pages each having one or more columns. In a read operation, the semiconductor memory may sense data of resistive storage cells included in a selected page by continuously active-precharging one or more word lines among the plurality of word lines in a period in which the selected page among the plurality of pages is activated, and thus a read operation speed of the temporary storage device 1340 may be increased. As a result, and the performance of the data storage system 1300 may be improved.

Figure 12:
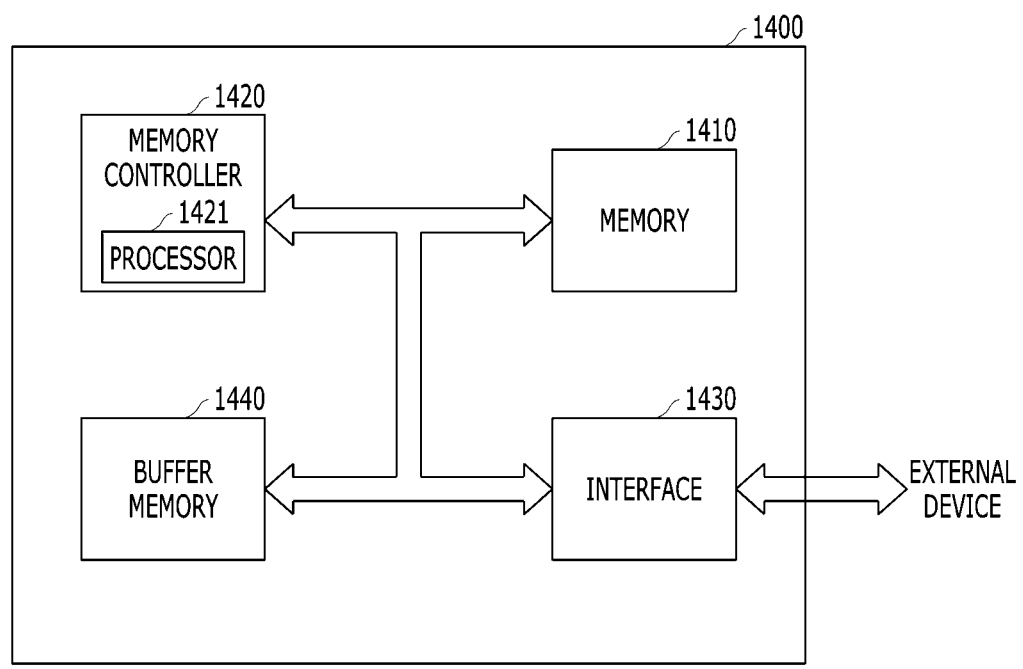
FIG. 12 is a configuration diagram illustrating an example of a memory system which is implemented with a memory device in accordance with an embodiment.

FIG. 12 is a configuration diagram illustrating an example of a memory system which is implemented with a memory device in accordance with an embodiment.

Referring to FIG. 12, a memory system 1400 may include a memory 1410 for storing data and having a non-volatile characteristic, a memory controller 1420 for controlling the memory, and an interface 1430 for coupling to an external device. The memory system 1400 may be a card type such as a solid state disk (SSD), an universal serial bus memory (USBM), a secure digital (SD), a mini secure digital card (mSD), a micro SD, a secure digital high capacity (SDHC), a memory stick card, a smart media card (SM), a multi media card (MMC), an embedded MMC (eMMC), a compact flash (CF) and so on.

The memory 1410 may include one or more of the embodiments of the memory devices as described above. For example, the memory 1410 may include a plurality of word lines; and a plurality of columns having a plurality of resistive storage cells corresponding to the plurality of word lines, wherein the plurality of columns are divided into a plurality of pages each having one or more columns. In a read operation, the semiconductor memory may sense data of resistive storage cells included in a selected page by continuously active-precharging one or more word lines among the plurality of word lines in a period in which the selected page among the plurality of pages is activated, and thus a read operation speed of the memory 1410 may be increased. As a result, and the performance of the memory system 1400 may be improved.

The memory may include a read only memory (ROM), a NOR flash memory, a NAND flash memory, a phase change random access memory (PRAM), a resistive random access memory (RRAM), a magnetic random access memory (MRAM) and so on having a non-volatile characteristic.

The memory controller 1420 may control exchange of data between the memory 1410 and the interface 1430. The memory controller 1420 may include a processor 1421 which performs an operation and so on for processing commands which are input through the interface 1430 from the outside of the memory system 1400.

The interface 1430 may exchange a command, data and so on between the memory system 1400 and the external device. The interface 1430 may be compatible with interfaces which are used in a device such as such as the universal serial bus memory (USBM), the secure digital (SD), the mini secure digital card (mSD), the micro SD, the secure digital high capacity (SDHC), the memory stick card, the smart media card (SM), the multi media card (MMC), the embedded MMC (eMMC), the compact flash (CF) and so on, or be compatible with interfaces which are used in the device similar thereto. The interface 1430 may be compatible with one or more interfaces which have different types.

The memory system 1400 may further include a buffer memory 1440 to efficiently transfer an input and an output of the data between the interface 1430 and the memory 1410 according to diversification and high performance of an interface with the external device, the memory controller, the memory system. The buffer memory 1440 which temporarily stores data may include one or more of the embodiments of the memory devices as described above. For example, The buffer memory 1440 may include a plurality of word lines; and a plurality of columns having a plurality of resistive storage cells corresponding to the plurality of word lines, wherein the plurality of columns are divided into a plurality of pages each having one or more columns. In a read operation, the semiconductor memory may sense data of resistive storage cells included in a selected page by continuously active-precharging one or more word lines among the plurality of word lines in a period in which the selected page among the plurality of pages is activated, and thus a read operation speed of the temporary storage device 1340 may be increased. As a result, and the performance of the data storage system 1300 may be improved. The read operation speed of the buffer memory 1440 may be increased, and as a result, and the performance of the memory system 1400 may be improved.

The buffer memory 1440 may include a static random access memory (SRAM) and a dynamic random access memory (DRAM) having a volatile characteristic, and include a read only memory (ROM), a NOR Flash Memory, a NAND Flash Memory, a phase change random access memory (PRAM), a resistive random access memory (RRAM), a spin transfer torque random access memory (STTRAM), a magnetic random access memory (MRAM) and so on having a non-volatile characteristic. On the other hand, the buffer memory 1440 may not include the embodiment of the memory devices as described above, and may include the static random access memory (SRAM), the dynamic random access memory (DRAM) having the volatile characteristic, and include the read only memory (ROM), the NOR Flash Memory, the NAND Flash Memory, the phase change random access memory (PRAM), the resistive random access memory (RRAM), the spin transfer torque random access memory (STTRAM), the magnetic random access memory (MRAM) and so on having the non-volatile characteristic.

The characteristic of the electronic device or system in FIGS. 8 to 12 may be implemented with various devices, a system, or an application. For example, a mobile phone or other portable communication device, a tablet computer, a notebook or laptop computer, a game machine, a smart TV set, a TV set-top box, a multi media server, a digital camera having a wired and wireless communication function, a wristwatch or other wearing device having a wireless communication function.

Although various embodiments have been described for illustrative purposes, it will be apparent to those skilled in the art that various changes and modifications may be made without departing from the spirit and scope of the invention as defined in the following claims.

What is claimed is:

1. An electronic device including:
   a semiconductor memory,
   the semiconductor memory comprising:
   a plurality of word lines including a first word line and a second word line;
   a plurality of local line pairs coupled to which a plurality of resistive storage cells corresponding to one word line among the plurality of word lines are coupled, each of the local line pairs including a local bit line and a local source line;
   global line pairs corresponding to the plurality of local line pairs, each of the global line pairs including a global bit line and a global source line; and
   sense amplifiers coupled to a corresponding global line pair among the global line pairs and for sensing data of a selected resistive storage cell,
   wherein the semiconductor memory is divided into a plurality of pages, each page including a part of the plurality resistive storage cells connected to two or more global line pairs among the global line pairs and the plurality of word lines, and in a read operation, the semiconductor memory continuously active-precharges the first word line and the second word line in a period in which the selected page among the plurality of pages is activated, and senses data of resistive storage cells included in a selected page, and
   wherein the first word line and the second word line are activated in non-overlapping periods.

2. The electronic device of claim 1, wherein each of the plurality of pages corresponds to one or more sense amplifiers of the sense amplifiers.

3. The electronic device of claim 2, wherein the period in which the selected page is activated is a period in which one or more sense amplifiers are activated corresponding to the selected page among the sense amplifiers.

4. The electronic device of claim 3, wherein the sense amplifier senses data of a resistive storage cell which is coupled to a selected local line pair corresponding to the coupled the global line pair among the plurality of the local line pairs and an activated word line among the plurality of word lines in the activated period.

5. An electronic device including:
   a semiconductor memory,
   the semiconductor memory comprising:
   a plurality of word lines;
   a plurality of local line pairs coupled to which a plurality of resistive storage cells corresponding to one word line among the plurality of word lines are coupled, each of the local line pairs including a local bit line and a local source line;

global line pairs corresponding to the plurality of local line pairs, each of the global line pairs including a global bit line and a global source line; and sense amplifiers coupled to a corresponding global line pair among the global line pairs and for sensing data of a selected resistive storage cell, wherein the semiconductor memory is divided into a plurality of pages having one or more global line pairs among the global line pairs, and in a read operation, the semiconductor memory continuously active-precharges one or more word lines among the plurality of word lines in a period in which the selected page is activated among the plurality of pages and senses data of resistive storage cells included in a selected page, wherein when two or more read operations continuously perform, and the same page is selected in the two or more read operations, the selected page is maintained as an activation state until the last read operation of the two or more read operations is terminated from start of a first read operation of the two or more read operations.

6. The electronic device of claim 1, wherein the resistive storage cell comprises:

a selection element which is coupled to a corresponding word line; and a variable resistance element of which a resistance value is determined according to data stored in the resistive storage cell, and wherein the selection element and the variable resistance element are coupled between a corresponding local line pair among the local line pairs.

7. The electronic device of claim 6, wherein the variable resistance element includes a metal oxide material and a structure having a tunnel barrier interposed between two magnetic layers.

8. The electronic device of claim 1, further comprising a processor, wherein the processor comprising:

a core unit suitable for performing an operation corresponding to a command using data according to the command input from an outside of the processor; a cache memory unit suitable for storing data to be operated, data corresponding to an operation result, or an address of the data to be operated; and a bus interface which is coupled between the core unit and the cache memory unit, and transfers data between the core unit and the cache memory unit, and wherein the semiconductor memory is a part of the cache memory unit within the processor.

9. The electronic device of claim 1, further comprising a data storage system, wherein the data storage system comprising:

a storage device suitable for storing data and retaining the stored data regardless of a power supply;

a controller suitable for controlling data input/output of the storage device according to a command input from an outside;

a temporary storage device suitable for temporarily storing the data which is exchanged between the storage device and the outside; and an interface suitable for performing communication between one or more of the storage device, the controller and the temporary storage device and the outside, and wherein the semiconductor memory is a part of the storage device or the temporary storage device within the data storage system.

10. The electronic device of claim 5, wherein each of the plurality of pages corresponds to one or more sense amplifiers of the sense amplifiers.

11. The electronic device of claim 5, wherein the resistive storage cell comprises:

a selection element which is coupled to a corresponding word line; and a variable resistance element of which a resistance value is determined according to data stored in the resistive storage cell, and wherein the selection element and the variable resistance element are coupled between a corresponding local line pair among the local line pairs.

12. The electronic device of claim 11, wherein the variable resistance element includes a metal oxide material and a structure having a tunnel barrier interposed between two magnetic layers.

13. The electronic device of claim 5, further comprising a processor, wherein the processor comprising:

a core unit suitable for performing an operation corresponding to a command using data according to the command input from an outside of the processor; a cache memory unit suitable for storing data to be operated, data corresponding to an operation result, or an address of the data to be operated; and a bus interface which is coupled between the core unit and the cache memory unit, and transfers data between the core unit and the cache memory unit, and wherein the semiconductor memory is a part of the cache memory unit within the processor.

14. The electronic device of claim 5, further comprising a data storage system, wherein the data storage system comprising:

a storage device suitable for storing data and retaining the stored data regardless of a power supply;

a controller suitable for controlling data input/output of the storage device according to a command input from an outside;

a temporary storage device suitable for temporarily storing the data which is exchanged between the storage device and the outside; and an interface suitable for performing communication between one or more of the storage device, the controller and the temporary storage device and the outside, and wherein the semiconductor memory is a part of the storage device or the temporary storage device within the data storage system.

* * * * *